United States Patent
Chen et al.

(10) Patent No.: US 9,406,552 B2
(45) Date of Patent: Aug. 2, 2016

(54) SEMICONDUCTOR DEVICE HAVING CONDUCTIVE VIA AND MANUFACTURING PROCESS

(71) Applicant: Advanced Semiconductor Engineering, Inc., Kaohsiung (TW)

(72) Inventors: Yung-Jen Chen, Kaohsiung (TW);
Yi-Chuan Ding, Kaohsiung (TW);
Min-Lung Huang, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 13/721,599

(22) Filed: Dec. 20, 2012

(65) Prior Publication Data
US 2014/0175663 A1    Jun. 26, 2014

(51) Int. Cl.
*H01L 23/48* (2006.01)
*H01L 21/768* (2006.01)
(Continued)

(52) U.S. Cl.
CPC ............ *H01L 21/768* (2013.01); *H01L 21/486* (2013.01); *H01L 23/49816* (2013.01); *H01L 23/49827* (2013.01); *H01L 23/5389* (2013.01); *H01L 24/19* (2013.01); *H01L 24/96* (2013.01); *H01L 2224/12105* (2013.01); *H01L 2924/12042* (2013.01); *H01L 2924/181* (2013.01)

(58) Field of Classification Search
CPC ........ H01L 23/28; H01L 23/48; H01L 23/485
USPC .......... 257/508, 739, 750, 773, 774, 788, 789
See application file for complete search history.

(56) References Cited

U.S. PATENT DOCUMENTS

| | | | |
|---|---|---|---|
| 3,761,782 | A | 9/1973 | Youmans |
| 4,394,712 | A | 7/1983 | Anthony et al. |

(Continued)

FOREIGN PATENT DOCUMENTS

| | | |
|---|---|---|
| CN | 1466777 A | 1/2004 |
| CN | 101546734 A | 9/2009 |

(Continued)

OTHER PUBLICATIONS

Search Report RCO (Taiwan) Patent Application No. 102147628 mailed Oct. 23, 2015.
(Continued)

*Primary Examiner* — Benjamin Sandvik
*Assistant Examiner* — Herve Assouman
(74) *Attorney, Agent, or Firm* — Stetina Brunda Garred & Brucker

(57) ABSTRACT

In accordance with the present invention, there is provided a semiconductor device comprising a semiconductor die or chip, a package body and a through package body via. The semiconductor chip includes a plurality of conductive pads. The package body encapsulates a sidewall of the semiconductor chip, and has at least one hole formed therein having a sidewall which is of a prescribed first surface roughness value. The through package body via is disposed in the hole of the package body and comprises a dielectric material and at least one conductive interconnection metal. The dielectric material is disposed on the sidewall of the hole and defines at least one bore having a sidewall which is of a second surface roughness value less than the first surface roughness value. The interconnection metal is disposed within the bore.

20 Claims, 14 Drawing Sheets

(51) Int. Cl.
  *H01L 23/498* (2006.01)
  *H01L 21/48* (2006.01)
  *H01L 23/538* (2006.01)
  *H01L 23/00* (2006.01)

(56) References Cited

U.S. PATENT DOCUMENTS

| | | | |
|---|---|---|---|
| 4,499,655 A | 2/1985 | Anthony et al. | |
| 4,807,021 A | 2/1989 | Okumura | |
| 4,842,699 A | 6/1989 | Hua et al. | |
| 4,897,708 A | 1/1990 | Clements | |
| 4,982,265 A | 1/1991 | Watanabe et al. | |
| 5,166,097 A | 11/1992 | Tanielian et al. | |
| 5,191,405 A | 3/1993 | Tomita et al. | |
| 5,229,647 A | 7/1993 | Gnadinger et al. | |
| 5,239,448 A | 8/1993 | Perkins et al. | |
| 5,308,443 A | 5/1994 | Sugihara et al. | |
| 5,404,044 A | 4/1995 | Booth et al. | |
| 5,615,477 A | 4/1997 | Sweitzer et al. | |
| 5,643,831 A | 7/1997 | Ochiai et al. | |
| 5,998,292 A | 12/1999 | Black et al. | |
| 6,276,599 B1 | 8/2001 | Ogawa | |
| 6,329,631 B1 | 12/2001 | Yueh | |
| 6,380,628 B2* | 4/2002 | Miller et al. | 257/762 |
| 6,406,934 B1 | 6/2002 | Glenn et al. | |
| 6,448,506 B1 | 9/2002 | Glenn et al. | |
| 6,457,633 B1 | 10/2002 | Takashima et al. | |
| 6,500,564 B1* | 12/2002 | Shiobara et al. | 428/620 |
| 6,577,013 B1 | 6/2003 | Glenn et al. | |
| 6,670,269 B2 | 12/2003 | Mashino | |
| 6,699,787 B2 | 3/2004 | Mashino et al. | |
| 6,740,950 B2 | 5/2004 | Paek | |
| 6,812,549 B2 | 11/2004 | Umetsu et al. | |
| 6,815,348 B2 | 11/2004 | Mashino | |
| 6,962,829 B2 | 11/2005 | Glenn et al. | |
| 7,078,269 B2 | 7/2006 | Yamasaki et al. | |
| 7,134,198 B2 | 11/2006 | Nakatani et al. | |
| 7,157,372 B1 | 1/2007 | Trezza | |
| 7,185,426 B1 | 3/2007 | Hiner et al. | |
| 7,215,032 B2 | 5/2007 | Trezza | |
| 7,222,420 B2 | 5/2007 | Moriizumi | |
| 7,238,590 B2 | 7/2007 | Yang | |
| 7,262,475 B2 | 8/2007 | Kwon et al. | |
| 7,276,787 B2 | 10/2007 | Edelstein et al. | |
| 7,285,434 B2 | 10/2007 | Yee et al. | |
| 7,298,030 B2 | 11/2007 | McWilliams et al. | |
| 7,334,326 B1 | 2/2008 | Huemoeller et al. | |
| 7,365,436 B2 | 4/2008 | Yamano | |
| 7,371,602 B2 | 5/2008 | Yee | |
| 7,388,293 B2 | 6/2008 | Fukase et al. | |
| 7,415,762 B2 | 8/2008 | Fukase et al. | |
| 7,425,507 B2* | 9/2008 | Lake | H01L 21/30655 257/E21.259 |
| 7,482,272 B2 | 1/2009 | Trezza | |
| 7,508,057 B2 | 3/2009 | Shiraishi et al. | |
| 7,508,079 B2 | 3/2009 | Higashi | |
| 7,528,053 B2 | 5/2009 | Huang et al. | |
| 7,538,033 B2 | 5/2009 | Trezza | |
| 7,553,752 B2 | 6/2009 | Kuan et al. | |
| 7,560,744 B2 | 7/2009 | Hsiao et al. | |
| 7,598,163 B2 | 10/2009 | Callahan et al. | |
| 7,605,463 B2 | 10/2009 | Sunohara et al. | |
| 7,625,818 B2 | 12/2009 | Wang | |
| 7,633,765 B1 | 12/2009 | Scanlan et al. | |
| 7,642,132 B2 | 1/2010 | Huang et al. | |
| 7,656,023 B2 | 2/2010 | Sunohara et al. | |
| 7,659,202 B2 | 2/2010 | Trezza | |
| 7,666,711 B2 | 2/2010 | Pagaila et al. | |
| 7,678,685 B2 | 3/2010 | Sunohara et al. | |
| 7,681,779 B2 | 3/2010 | Yang | |
| 7,687,397 B2 | 3/2010 | Trezza | |
| 7,691,747 B2 | 4/2010 | Lin et al. | |
| 7,733,661 B2 | 6/2010 | Kossives et al. | |
| 7,741,148 B1 | 6/2010 | Marimuthu et al. | |
| 7,741,152 B2 | 6/2010 | Huang et al. | |
| 7,741,156 B2 | 6/2010 | Pagaila et al. | |
| 7,772,081 B2 | 8/2010 | Lin et al. | |
| 7,772,118 B2 | 8/2010 | Yamano | |
| 7,786,008 B2 | 8/2010 | Do et al. | |
| 7,786,592 B2 | 8/2010 | Trezza | |
| 7,795,140 B2 | 9/2010 | Taguchi et al. | |
| 7,808,060 B2 | 10/2010 | Hsiao | |
| 7,808,111 B2 | 10/2010 | Trezza | |
| 7,811,858 B2 | 10/2010 | Wang et al. | |
| 7,816,265 B2 | 10/2010 | Wang | |
| 7,842,597 B2 | 11/2010 | Tsai | |
| 7,994,634 B2 | 8/2011 | Kita et al. | |
| 8,617,987 B2 | 12/2013 | Gan et al. | |
| 9,245,838 B2 | 1/2016 | Sakamoto et al. | |
| 2002/0017855 A1 | 2/2002 | Cooper et al. | |
| 2002/0094605 A1 | 7/2002 | Pai et al. | |
| 2003/0090883 A1 | 5/2003 | Asahi et al. | |
| 2004/0124518 A1 | 7/2004 | Karnezos | |
| 2004/0259292 A1 | 12/2004 | Beyne et al. | |
| 2005/0189635 A1 | 9/2005 | Humpston et al. | |
| 2005/0258545 A1 | 11/2005 | Kwon | |
| 2006/0027632 A1 | 2/2006 | Akram | |
| 2006/0197216 A1 | 9/2006 | Yee | |
| 2006/0292877 A1 | 12/2006 | Lake | |
| 2007/0048896 A1 | 3/2007 | Andry et al. | |
| 2007/0082183 A1* | 4/2007 | Murai | H05K 3/421 428/209 |
| 2007/0138562 A1 | 6/2007 | Trezza | |
| 2007/0187711 A1 | 8/2007 | Hsiao | |
| 2007/0262336 A1* | 11/2007 | Tamaki | H01L 33/60 257/98 |
| 2008/0048337 A1 | 2/2008 | Takahashi et al. | |
| 2008/0272486 A1 | 11/2008 | Wang et al. | |
| 2009/0032928 A1 | 2/2009 | Chiang et al. | |
| 2009/0039527 A1 | 2/2009 | Chan et al. | |
| 2009/0077796 A1* | 3/2009 | Sakamoto | H01L 21/568 29/832 |
| 2009/0101400 A1 | 4/2009 | Yamakoshi | |
| 2009/0140436 A1 | 6/2009 | Wang | |
| 2009/0146297 A1 | 6/2009 | Badakere et al. | |
| 2009/0166785 A1 | 7/2009 | Camacho et al. | |
| 2009/0243045 A1 | 10/2009 | Pagaila et al. | |
| 2009/0243120 A1* | 10/2009 | Kita et al. | 257/774 |
| 2009/0294959 A1 | 12/2009 | Chiang et al. | |
| 2009/0302435 A1 | 12/2009 | Pagaila et al. | |
| 2009/0302437 A1 | 12/2009 | Kim et al. | |
| 2009/0309235 A1 | 12/2009 | Suthiwongsunthorn et al. | |
| 2009/0321916 A1 | 12/2009 | Wang et al. | |
| 2010/0059855 A1 | 3/2010 | Lin et al. | |
| 2010/0065948 A1 | 3/2010 | Bae et al. | |
| 2010/0133704 A1 | 6/2010 | Marimuthu et al. | |
| 2010/0140737 A1 | 6/2010 | Lin et al. | |
| 2010/0140751 A1 | 6/2010 | Tay et al. | |
| 2010/0140752 A1 | 6/2010 | Marimuthu et al. | |
| 2010/0140776 A1 | 6/2010 | Trezza | |
| 2010/0148316 A1 | 6/2010 | Kim et al. | |
| 2010/0187681 A1 | 7/2010 | Chen et al. | |
| 2010/0197134 A1 | 8/2010 | Trezza | |
| 2010/0230759 A1 | 9/2010 | Yang et al. | |
| 2010/0230760 A1 | 9/2010 | Hung | |
| 2010/0230788 A1 | 9/2010 | Peng | |
| 2010/0244244 A1 | 9/2010 | Yang | |
| 2010/0276690 A1 | 11/2010 | Chen | |
| 2010/0308449 A1* | 12/2010 | Yang et al. | 257/690 |
| 2010/0327422 A1* | 12/2010 | Lee et al. | 257/690 |
| 2010/0327465 A1 | 12/2010 | Shen et al. | |
| 2011/0048788 A1 | 3/2011 | Wang et al. | |
| 2011/0068437 A1 | 3/2011 | Chiu et al. | |
| 2011/0136336 A1* | 6/2011 | Akram et al. | 438/613 |
| 2011/0177654 A1 | 7/2011 | Lee et al. | |
| 2011/0227220 A1 | 9/2011 | Chen et al. | |
| 2012/0103507 A1* | 5/2012 | Cho et al. | 156/253 |
| 2012/0119373 A1* | 5/2012 | Hunt | H01L 21/565 257/774 |

(56) References Cited

U.S. PATENT DOCUMENTS

2012/0199972 A1 8/2012 Pagaila et al.
2013/0334682 A1* 12/2013 Kim .................... H01L 23/295
                                                      257/737

FOREIGN PATENT DOCUMENTS

| CN | 102280440 A | 12/2011 |
| CN | 102420210 A | 4/2012 |
| JP | 2002246540 A | 8/2002 |
| JP | 2004228135 A | 8/2004 |
| TW | 201044471 A | 6/2009 |
| TW | 201216419 A | 4/2012 |

OTHER PUBLICATIONS

Search Report for Taiwanese Patent Application No. 102147628.
SIPO Office Action issued for Chinese Patent Application No. 201310712235.9 mailed on Feb. 2, 2016.
Search Report. ROC (Taiwan) Patent Application No. 102147628, mailed on May 31, 2016.

* cited by examiner

SEMICONDUCTOR DEVICE HAVING CONDUCTIVE VIA AND MANUFACTURING PROCESS

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor devices and, more particularly, to a semiconductor package and corresponding process for fabricating the same.

2. Description of the Related Art

As is known in the electrical arts, conventional fan-out semiconductor packages typically comprises at least one conductive via formed within the package body of the package. In the manufacturing process for such semiconductor packages, the package body of the package is drilled through the use of a laser to form at least one via hole therein. This via hole is then plated and thereafter filled with conductive metals so as to form the conductive via. In conventional fan-out semiconductor packages, the package body is a composite material which includes epoxy resin and SiO2 fillers. Because the laser absorbability characteristics of the epoxy resin and SiO2 fillers are different, and the sizes of the SiO2 fillers typically vary from 10 to 100 µm, the circularity of the sidewall of the via hole is often poor, the surface roughness of sidewall of the hole is high, and the size of the hole is larger than optimal upon the completion of the aforementioned laser-drilling process. These particular deficiencies arise despite the use of high accuracy lasers for the drilling process. As a result, in the process of forming the conductive via as described above, the plating and subsequent hole-filling processes process are complex and time consuming which increases the associated costs, with the plating quality further being difficult to control.

More particularly, in conventional fan-out semiconductor packages, the plating of the via hole is facilitated through the use of a sputtering process. In the sputtering machine, the plating material is dispensed therefrom in a manner in which it enters a corresponding via hole in a direction which is generally parallel to the sidewall of the hole. This direction of entry into the hole, coupled with the extremely small particle sizes of the plating material being dispensed from the sputtering machine, often results in the fillers hindering the complete, uniform application of the plating layer to the sidewall. In this regard, the surface roughness of the sidewall of the hole is attributable to such sidewall being partially defined by portions of the fillers which protrude from the epoxy. Whereas the plating layer is typically applied to the top sides of the exposed fillers which face the sputtering machine, the opposite bottom sides of these fillers often have no plating layer applied thereto by the sputtering process. As a result, when a metal such as copper is ultimately filled into the hole to complete the formation of the conductive via, such metal material will easily adhere to the plating layer, but will not easily adhere to those areas of the sidewall (e.g., the undersides of the fillers) which do not have the plating layer applied thereto. This lack of adhesion typically results in the formation of voids, which could compromise the integrity of the conductive path defined by the via. Though the potential for such incomplete plating, and the resultant formation of voids, can be reduced by increasing the amount of material applied in (and thus the time taken to time to complete) the sputtering process, this gives rise to an undesirable increase in cost coupled with a decrease in productivity.

The present invention addresses and overcomes these deficiencies by providing a semiconductor device and corresponding process for fabricating the same wherein the semiconductor device includes at least one conductive via collectively defined by several materials of differing properties as optimizes both the manufacturability and functionality thereof. These, as well other features and advantages of the present invention, will be described in more detail below.

BRIEF SUMMARY OF THE INVENTION

In accordance with one embodiment of the present invention, there is provided a semiconductor device comprising a semiconductor die or chip, a package body and a through package body via. The chip has an active surface and a plurality of pads disposed adjacent to the active surface. The package body encapsulates a sidewall of the chip, and has at least one hole formed therein including a sidewall which is of a prescribed first surface roughness value. The through package body via is disposed in the hole of the package body and comprises a dielectric material and at least one conductive interconnection metal. The dielectric material is disposed on the sidewall of the hole and defines at least one bore having a sidewall which is of a second surface roughness value. The second surface roughness value of the sidewall of the bore is less than that of the first surface roughness value of the sidewall of the hole. The interconnection metal is disposed within the bore.

In accordance with another embodiment of the present invention, the semiconductor device may also comprise a patterned conductive layer. The patterned conductive layer is disposed adjacent to the active surface of the chip and electrically connects the pads of the chip to the interconnection metal of the through package body via which is disposed in the hole of the package body. In addition, a portion of the dielectric material disposed on the sidewall of the hole in the package body may further partially cover a first surface of the package body.

In accordance with yet another embodiment the present invention the present invention, there is provided a method or process for fabricating the aforementioned semiconductor device. An exemplary process comprises the steps of: (a) forming the at least one hole in the package body, the hole being of the prescribed first surface roughness value; (b) filling the at least one hole with the dielectric material; (c) forming at least one bore in the dielectric material, the bore being of the prescribed second surface roughness value which is less than that of the first surface roughness value; and (d) filling the bore with the interconnection metal.

BRIEF DESCRIPTION OF THE DRAWINGS

These, as well as other features of the present invention, will become more apparent upon reference to the drawings wherein.

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
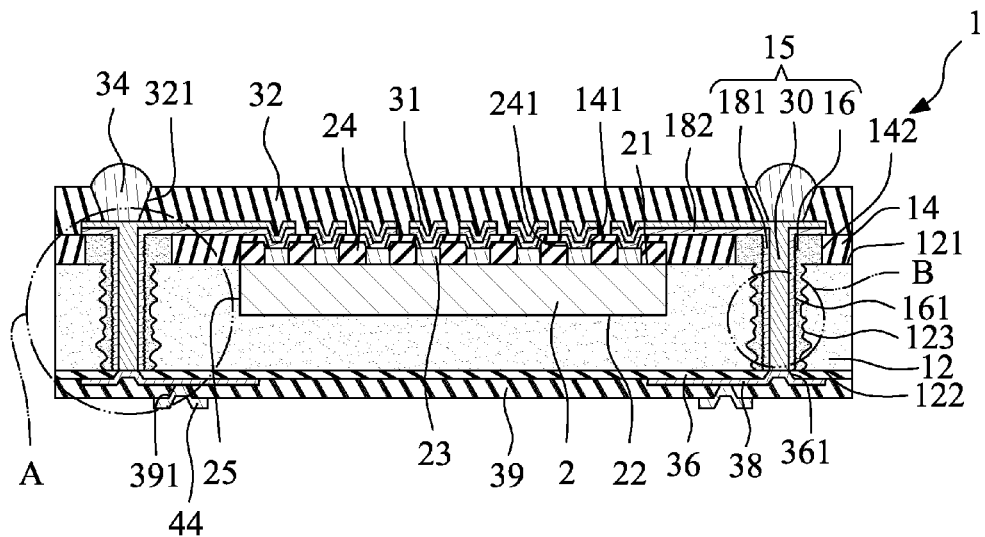
FIG. 1 is a cross-sectional view of a semiconductor device constructed in accordance with a first embodiment of the present invention.

Referring to FIG. 1, there is depicted a semiconductor device 1 constructed in accordance with one embodiment of the present invention. The semiconductor device 1 comprises a semiconductor die or chip 2, a package body 12, an upper redistribution layer (RDL) disposed over portions of the semiconductor chip 2 and an upper surface of the package body 12, a lower RDL disposed over portions of a lower surface of the package body 12 and at least one conductive via 15 formed in a through hole 123 which interconnects the upper RDL with the lower RDL.

The semiconductor chip 2 includes an active surface 21, and an opposed backside surface 22. Extending between the active and backside surfaces 21, 22 is a peripheral side surface 25. Disposed on the active surface 21 is a plurality of conductive terminals or pads 23. Also disposed on the active surface 21 is a protective layer 24. The protective layer 24, which is preferably a nitride layer or an oxide layer, includes a plurality of openings 241 formed therein which expose respective ones of the pads 23.

The package body 12 partially encapsulates the semiconductor chip 2. The package body 12 also covers or encapsulates both the side surface 25 and the backside surface 22 of the semiconductor chip 2. The package body 12 defines a first surface 121 which is substantially continuous or coplanar with the active surface 21 of the semiconductor chip 2, and a second surface 122 which is disposed in opposed relation to the first surface 121. The package body 12 may be comprised of a molding compound such as an epoxy resin.

The upper RDL includes a first passivation layer 14, an upper patterned surface seed layer 182, an upper patterned conductive layer 31, and a second passivation layer 32. The first passivation layer 14 covers the protective layer 24 applied to the active surface 21 of the semiconductor chip 2. In this regard, the first passivation layer 14 includes a plurality of inner openings 141 which are formed therein and are coaxially aligned with respective ones of the openings 241 disposed in the protective layer 24. As a result, each of the pads 23 of the chip 2 is exposed in a corresponding coaxially aligned pair of the openings 241 and inner openings 141.

In addition to the inner openings 141, the first passivation layer 14 includes at least one outer opening 142 which is aligned with the at least one hole 123 formed in the package body 12. As will be recognized, in the embodiment of the semiconductor device 1 shown in FIG. 1 wherein a plurality of through holes 123 are formed in the package body 12 and surround the semiconductor chip 2, the first passivation layer 14 includes a plurality of outer openings 142 formed therein, each of which is coaxially aligned with a respective one of the holes 123. Thus, in the semiconductor device 1, the number of outer openings 142 formed within the first passivation layer 14 is preferably equal to the number of holes 123 formed in the package body 12, with each such outer opening 142 being aligned with a corresponding hole 123. The first passivation layer 14 may be formed from a non-conductive polymer such as polyimide (PI), or an epoxy. Alternatively, the first passivation layer 14 may be inorganic, and comprise a material such as silicone dioxide ($SiO_2$). Still further, the first passivation layer 14 may comprise a photo-sensitive polymer such as benzocyclobutene (BCB). The formation of the first passivation layer 14 may be facilitated through the implementation of a spin coating or a spray coating process. As seen in FIG. 1, the peripheral side surface defined by the first passivation layer 14 is preferably substantially continuous or coplanar with the peripheral side surface defined by the package body 12.

The second passivation layer 32 of the upper RDL is disposed on the patterned conductive layer 31 and the first passivation layer 14. The second passivation layer 32 has a plurality of second openings 321 formed therein. The second openings 321 expose portions of respective ones of the segments defined by the patterned conductive layer 31. The second passivation layer 32 may be formed from a non-conductive polymer such as polyimide (PI), or an epoxy. Alternatively, the second passivation layer 32 may be inorganic, and comprise a material such as silicone dioxide ($SiO_2$). Still further, the second passivation layer 32 may comprise a photo-sensitive polymer such as benzocyclobutene (BCB). The formation of the second passivation layer 32 may be facilitated through the implementation of a spin coating or a spray coating process. As seen in FIG. 1, the peripheral side surface defined by the second passivation layer 32 is preferably substantially continuous or coplanar with the peripheral side surfaces defined by both the first passivation layer 14 and the package body 12. Those of ordinary skill in the art will recognize that the first and second passivation layers 14, 32 may be fabricated from identical or dissimilar materials. Solder balls 34 are disposed in the second openings 321 of the second passivation layer 32 to contact respective ones of the segments of the patterned conductive layer 31.

In the semiconductor device 1, the upper patterned conductive layer 31 electrically connects the pads 23 of the semiconductor chip 2 with the conductive via(s) 15 and with the external contacts or solder balls 34 disposed in the second openings 321 of the second passivation layer 32. Thus, the upper RDL provides for signal routing to and from the semiconductor chip 2 with either an external printed circuit board (not shown) or a second semiconductor device (also not shown) which could be connected or mounted to the lower RDL.

The lower RDL includes a third passivation layer 36, a backside circuit layer 38, a fourth passivation layer 39, and at least one lower pad or under bump metallization 44 (UBM). The third passivation layer 36 is applied to and covers the second surface 122 of the package body 12. The third passivation layer 36 has a plurality of third openings 361 disposed therein. Each of the third openings 361 is aligned with and thus exposes a portion of a respective one of the vias 15. The third passivation layer 36 may be formed from a non-conductive polymer such as polyimide (PI), or an epoxy. Alternatively, the third passivation layer 36 may be inorganic, and comprise a material such as silicone dioxide ($SiO_2$). Still further, the third passivation layer 36 may comprise a photo-sensitive polymer such as benzocyclobutene (BCB). The formation of the third passivation layer 36 may be facilitated through the implementation of a spin coating or a spray coating process. As seen in FIG. 1, the peripheral side surface defined by the third passivation layer 36 is preferably substantially continuous or coplanar with the peripheral side surface defined by the package body 12.

The backside circuit layer 38 of the lower RDL is disposed on the third passivation layer 36. The backside circuit layer 38 is patterned to define a plurality of discrete segments, each of which extends into a respective one of the third openings 361 so as to contact a portion of a respective one of the vias 15. Those of ordinary skill in the art will recognize that the backside circuit layer 38, and hence each segment defined by the patterning thereof, may comprise the combination of a seed layer disposed on the third passivation layer 36 and a conductive layer which is disposed on the seed layer.

The fourth passivation layer 39 of the lower RDL is disposed on both the backside circuit layer 38 and the third passivation layer 36. The fourth passivation layer 39 has a plurality of fourth openings 391 formed therein. Each of the fourth openings 391 exposes a portion of a respective one of the segments defined by the patterned backside circuit layer 38. The fourth passivation layer 39 may be formed from a non-conductive polymer such as polyimide (PI), or an epoxy. Alternatively, the fourth passivation layer 39 may be inorganic, and comprise a material such as silicone dioxide ($SiO_2$). Still further, the fourth passivation layer 39 may comprise a photo-sensitive polymer such as benzocyclobutene (BCB). The formation of the fourth passivation layer 39 may be facilitated through the implementation of a spin coating or a spray coating process. As seen in FIG. 1, the peripheral side surface defined by the fourth passivation layer 39 is preferably substantially continuous or coplanar with the peripheral side surfaces defined by both the third passivation layer 36 and the package body 12. Those of ordinary skill in the art will recognize that the third and fourth passivation layers 36, 39 may be fabricated from identical or dissimilar materials. The under bump metallizations 44 (UBM's) are disposed in the fourth openings 391 of the fourth passivation layer 39 to contact respective segments of the patterned backside circuit layer 38.

Figure 2:
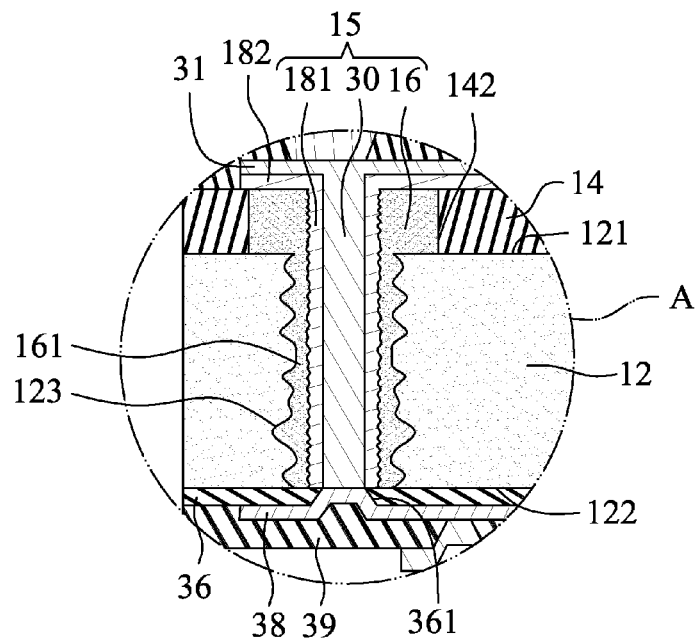
FIG. 2 is an enlargement of the encircled region B shown in FIG. 1.

Referring to FIG. 2, a magnified view of a conductive via 15 of the semiconductor device 1 and the interconnection to the upper and lower RDL's is illustrated. In the semiconductor device 1, each through hole 123 extends from the first surface 121 of the package body 12 to the second surface 122 thereof. A conductive via 15 is disposed within each through hole 123. Each via 15 comprises the combination of a dielectric material 16, a discrete segment of a patterned via seed layer 181, and an interconnection metal 30.

In each via 15, the dielectric material 16 is disposed within and covers the sidewall of the corresponding hole 123, i.e. the dielectric material 16 adheres to a portion of the package body 12 exposed by the through hole 123. The dielectric material 16 is further is disposed on and covers the sidewall of the corresponding outer opening 142 of the first passivation layer 14 which is coaxially aligned with the hole 123. A diameter of each outer opening 142 of the first passivation layer 14 is greater than that of the corresponding hole 123 of the package body 12. As a result, since the first passivation layer 14 is applied to the first surface 121 of the package body 12 prior to the formation of the hole 123 therein, during the laser drilling process used to facilitate the formation of the holes 123, the laser will only drill the package body 12, and will not affected by the first passivation layer 14. Therefore, the dielectric material 16 of each via 15 further covers a portion of the first surface 121 of the package body 12. The dielectric material 16 has at least one cavity or bore 161 extending from an upper surface to a lower surface in a manner as illustrated. Like each through hole 123, such bore 161 is preferably formed through the use of a laser drilling process. In this regard, as will be discussed in more detail below, in the process of forming each via 15, the dielectric material 16 is disposed into each through hole 123 and corresponding outer opening 142, with the corresponding bore 161 being subsequently formed in the dielectric material 16. As will also be discussed in more detail below, the via seed layer 181 is thereafter plated directly on to the sidewall of the bore 161, which is thereafter filled with the interconnection metal 30.

Figure 3:
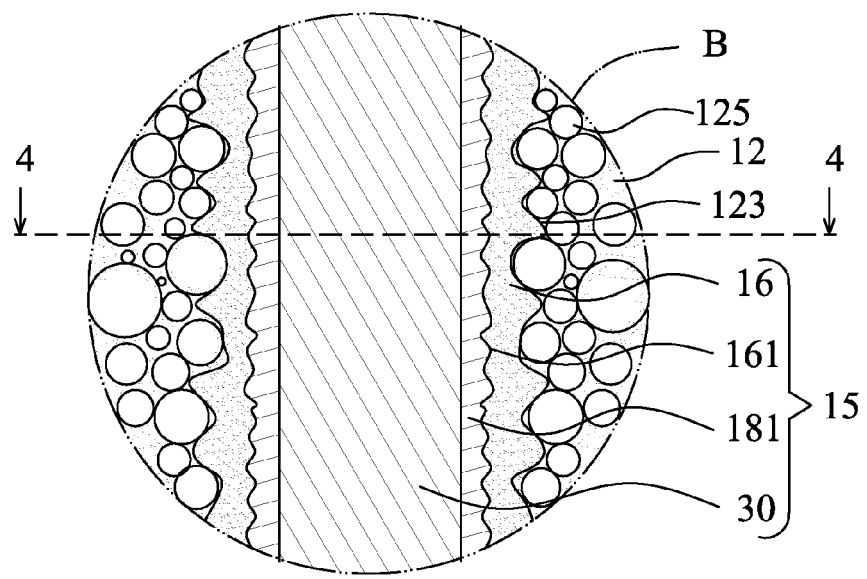
FIG. 3 is an enlargement of the encircled region A shown in FIG. 1.
Figure 4:
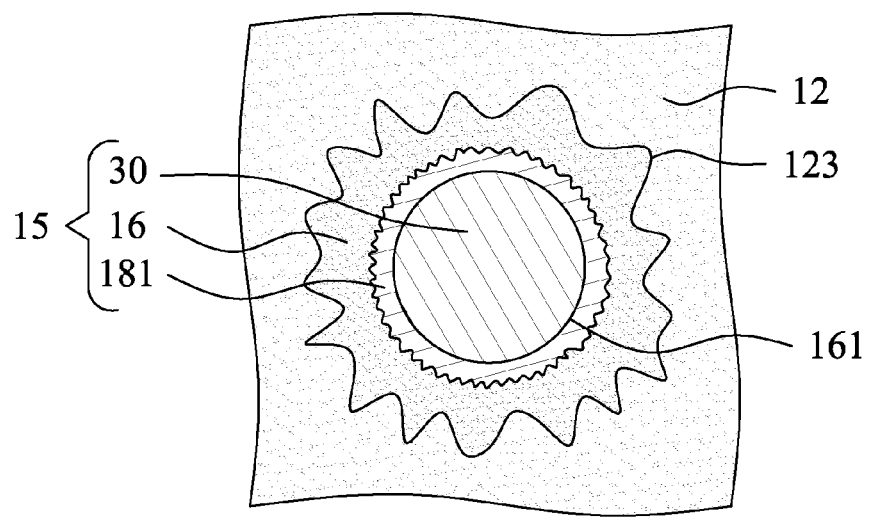
FIG. 4 is a cross-sectional view taken along line 4-4 of FIG. 3.

Referring to FIGS. 3 and 4 in combination, magnified views of a conductive via 15, to include variations in surface roughness are illustrated. In the semiconductor device 1, each through hole 123 is formed through the use of a laser drilling process, and has a preferred diameter in the range of from about 100 μm to about 500 μm. The package body 12 used in the semiconductor device 1 is preferably a composite material which includes epoxy resin and $SiO_2$ fillers 125, with the sizes of the $SiO_2$ fillers 125 varying from about 10 μm to about 100 μm. Since the laser absorption characteristics of the epoxy resin and the $SiO_2$ fillers 125 included in the package body 12 are different, the laser drilling process used to form the holes 123 causes each such hole 123 to define a sidewall which is of a first surface roughness value. In this regard, the first surface roughness value of the sidewall of each hole 123 is proportional to the size of the $SiO_2$ fillers 125 included in the package body 12. Typically, the first surface roughness value of the sidewall of the hole 123 is greater than about 20 μm. As indicated above, the inclusion of the $SiO_2$ fillers 125 within the package body 12 is the primary cause of the sidewall of each hole 123 having the aforementioned first surface roughness value.

The dielectric material 16 of each via 15 is preferably a polyimide (PI) or a solder mask which does not include the $SiO_2$ fillers 125 as does the package body 12. As a result of the absence of any $SiO_2$ fillers 125 in the dielectric material 16, the sidewall of the bore 161 formed by the aforementioned laser drilling process has a second surface roughness value in the range of from about 2 μm to about 20 μm, and typically in the range of from about 5 μm to about 10 μm. As will be recognized, the second surface roughness value of the sidewall of the bore 161 is thus typically less than the first surface roughness value of the sidewall of the corresponding hole 123. That is, the sidewall of the bore 161 is smoother than the sidewall of the corresponding hole 123, which provides certain advantages as will be discussed in more detail below. As seen in FIG. 4, the shape of the sidewall of the hole 123 is typically in the form of a non-perfect circle, with the shape of the sidewall of the bore 161 more closely approximating a perfect circle. That is, the circularity value of the bore 161 is greater than that of the hole 123.

Each discrete segment of the patterned via seed layer 181 which corresponds to a respective one of the vias 15 is formed on and thus covers the sidewall of the bore 161 formed in the dielectric material 16. In addition, each segment of the patterned via seed layer 181 transitions to a corresponding discrete segment of the patterned surface seed layer 182 of the upper RDL which is disposed on the first passivation layer 14 as indicated above. In the process of fabricating the semiconductor device 1, the patterned via and surface seed layers 181, 182 are formed at the same time, with each resultant pair of discrete segments thereof corresponding to each via 15 thus being integrally connected to each other. Each segment of the surface seed layer 182 is formed on the first passivation layer 14 so as to extend into one or more of the inner openings 141 defined thereby, and thus into contact with one or more of the pads 23 of the semiconductor chip 2.

In the semiconductor device 1, both the via seed layer 181 and the surface seed layer 182 are preferably fabricated from Ti/Cu. Due to the sidewall of each hole 123 being of the first surface roughness value described above, any attempt to plate the via seed layer 181 directly on such sidewall of the corresponding hole 123 would give rise to difficulties in controlling the plating quality of such via seed layer 181. In this regard, the thickness of the via seed layer 181 is in the range of from about 2 μm to about 20 μm, thereby making it difficult to plate the same directly on the relatively rough sidewall of the hole 123. In accordance with the present invention, each hole 123 is lined with the dielectric material 16 in the aforementioned manner, with the via seed layer 181 then being plated onto the sidewall of the bore 161 which is of the reduced second surface roughness value, thus overcoming the roughness issue.

More particularly, in the semiconductor device 1, the first surface roughness of the sidewall of each hole 123 is generally attributable to such sidewall being partially defined by portions of the $SiO_2$ fillers 125 which protrude from the epoxy. Along these lines, since it is contemplated that the via seed layer 181 will be formed through the use of the above-described sputtering process, any attempt to form such via seed layer 181 directly on the sidewall of the hole 123 by eliminating the dielectric material 16 would give rise to the same deficiencies highlighted above. In this regard, the $SiO_2$ fillers 125 would potentially hinder the complete, uniform application of the via seed layer 181 to the sidewall of the hole 123, which could in turn lead to the formation of voids between the interconnection metal 30 filled into the hole 123 and the sidewall thereof. These voids could increase the resistance of the resultant conductive via, and could further cause a defect upon the completion of a prescribed reliability test (e.g., TCT, HAST).

In contrast to the via seed layer 181 which is typically formed through the use of a sputtering process, the dielectric material 16 is preferably filled into each hole 123 as a fluid, and is thereafter cured to solidify the same. This formation process, coupled with the material properties of the dielectric material 16, results in the dielectric material 16 being deposited on the sidewall of the hole 123 with substantially less voids being defined therebetween in comparison to the voids that would result from the direct plating of the via seed layer 181 on to the sidewall of the hole 123. Further, since the second surface roughness value of the sidewall of the bore 161 formed in the dielectric material 16 is less than the first surface roughness value of the sidewall of the hole 123 (the sidewall of the bore 161 thus being smoother than the sidewall of the hole 123), there is a substantial reduction in occurrences of void formation between each discrete segment of the via seed layer 181 and the sidewall of the corresponding bore 161 when the sputtering process is used to facilitate the formation of the via seed layer 181. Thus, the inclusion of the dielectric material 16 within each via 15 effectively overcomes many of the difficulties in controlling the plating quality of the via seed layer 181 which would otherwise result from any attempt to plate the same directly onto the sidewall of the hole 123. Along these lines, in comparison to the increased time and cost that would be needed to achieve adequate plating quality of the via seed layer 181 directly onto the sidewall of the hole 123, the time associated with the plating of the via seed layer 181 on to the sidewall of the bore 161 is substantially shorter with the plating quality thereof being easier to control, thus resulting in a reduction in the manufacturing cost for the semiconductor device 1 coupled with an increase in the reliability thereof.

The interconnection metal 30 of each via 15 of the semiconductor device 1 is disposed within the bore 161 of the dielectric material 16 in direct contact with at least a portion of a corresponding segment of the via seed layer 181. As seen in FIG. 1, the interconnection metal 30 is a solid metal pillar. However, it is also contemplated that the interconnection metal 30 may alternatively comprise a core of insulation material which is surrounded by a conductive metal material. Thus, within each via 15 of the semiconductor device 1, the interconnection metal 30 is surrounded or circumvented by a corresponding segment of the via seed layer 181, which is in turn circumvented by the dielectric material 16 within the corresponding hole 123.

In the semiconductor device 1, the interconnection metal 30 of each via 15 included therein is integrally connected to a corresponding discrete segment of patterned conductive layer 31 of the upper RDL. The interconnection metal 30 of each via 15 and the corresponding segment of the patterned conductive layer 31 are formed at the same time, and are thus integrally connected to each other. Each segment of the patterned conductive layer 31 is disposed on and extends along a corresponding, underlying segment of the patterned surface seed layer 182 which, as indicated above, is formed on the first passivation layer 14 so as to extend into one or more of the inner openings 141 defined thereby, and thus into contact with one or more of the pads 23 of the semiconductor chip 2. Along these lines, the shape of each segment of the patterned conductive layer 31 is preferably the same as that segment of the patterned surface seed layer 182 upon which is formed, each segment of the patterned conductive layer 31 thus being operative to facilitate the electrical connection of the interconnection metal 30 of the via 15 to which it is integrally connected to at least one of the pads 23 of the semiconductor chip 2. In the semiconductor device 1, the interconnection metal 30 of each via 15, and hence the corresponding segment of the patterned conductive layer 31, is preferably fabricated from Cu. As such, each segment of the patterned conductive layer 31 effectively facilitates the electrical connection of one or more of the pads 23 of the semiconductor chip 2 to the interconnection metal 30 of a respective one of the vias 15 included in the semiconductor device 1.

Figure 5:
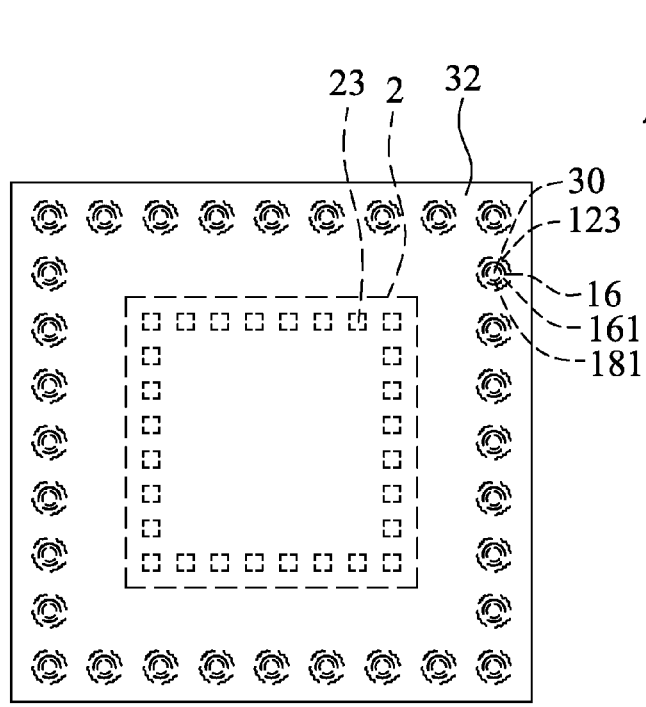
FIG. 5 is a top plan view of the semiconductor device shown in FIG. 1, wherein the second openings of the second passivation layer, the solder balls, the patterned conductive layer and the surface seed layer of the semiconductor device are omitted.

Referring to FIG. 5, in the semiconductor device 1, the multiple holes 123 formed in the package body 12 and extending between the first and second surfaces 121, 122 thereof are arranged in a generally quadrangular (e.g., square) pattern. In this regard, each hole 123 is positioned between the side surface 25 of the semiconductor chip 2 and a peripheral side surface defined by the package body 12.

Figure 6:
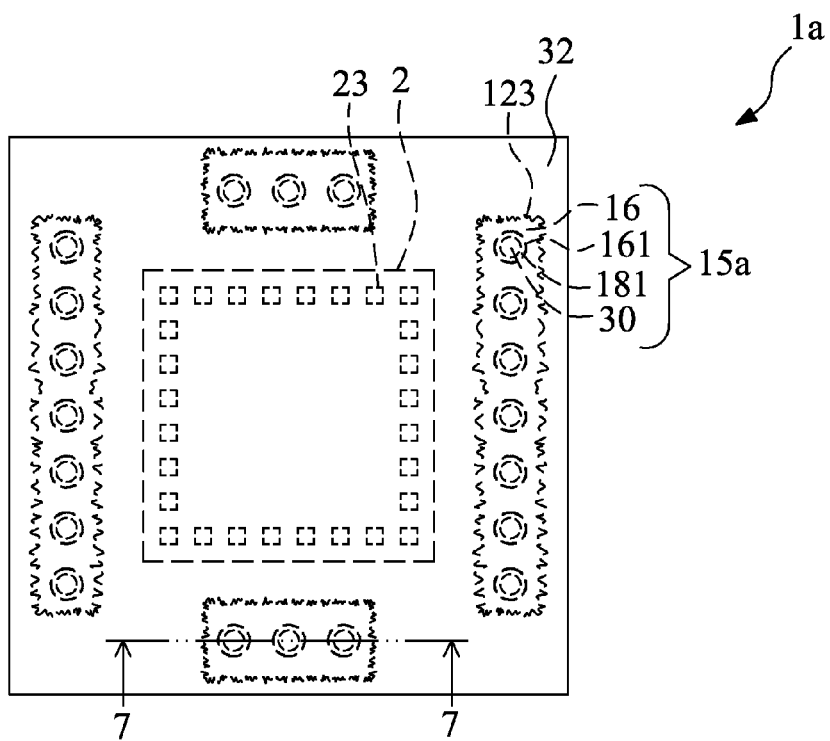
FIG. 6 is a top plan view of a semiconductor device constructed in accordance with a second embodiment of the present invention.

FIG. 6 depicts a semiconductor device 1a constructed in accordance with another embodiment of the present invention. The semiconductor device 1a is substantially similar to the semiconductor device 1 shown in FIGS. 1-5, with only the distinctions between the semiconductor devices 1, 1a being highlighted below.

The primary distinction between the semiconductor devices 1, 1a lies in the structure of the holes 123 included in the semiconductor device 1a in comparison to the holes 123 included in the semiconductor device 1. More particularly, whereas each hole 123 in the semiconductor device 1 has a generally circular configuration, each hole 123 in the semiconductor device 1a has a generally quadrangular (e.g. rectangular) configuration. Due to the increased size of each hole 123 in the semiconductor device 1a, the dielectric material 16 disposed therein may have a plurality of bores 161 formed therein via a laser drilling process, such bores 161 being formed in a prescribed pattern or arrangement. In the exemplary embodiment of the semiconductor device 1a shown in FIG. 6, only a total of four (4) holes 123 are formed in the package body 12. Each of the holes 123 of one opposed pair thereof accommodates seven (7) vias 15a, with the remaining opposed pair of the holes 123 each accommodating three (3) vias 15a. Those of ordinary skill in the art will recognize that the size and number of vias 15a accommodated by each of the holes 123 shown in FIG. 6 is exemplary only, and may be varied without departing from the spirit and scope of the present invention.

Figure 7:
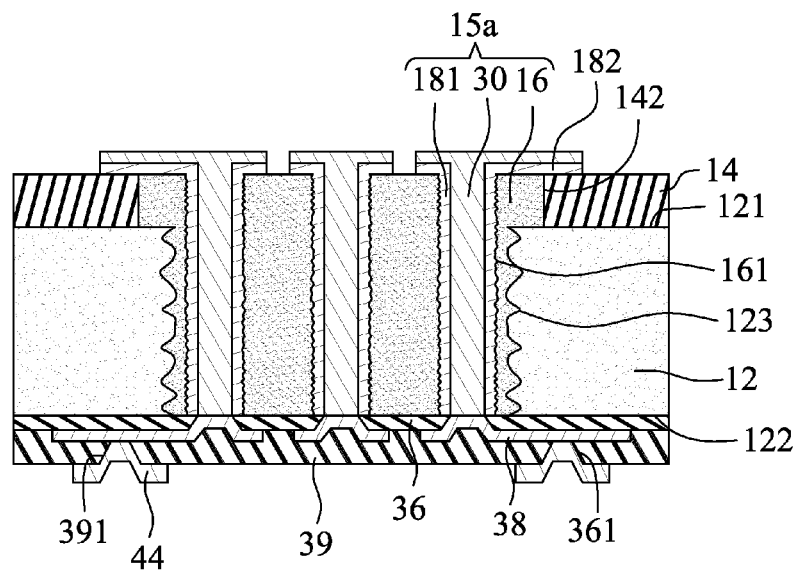
FIG. 7 is a cross-sectional view taken along line 7-7 of FIG. 6.

Referring to FIG. 7, each of the bores 161 formed in the dielectric material 16 disposed in each hole 123 of the semiconductor device 1a has a discrete segment of the patterned via seed layer 181 plated onto the sidewall thereof, and further has a dedicated interconnection metal 30 disposed therein. Thus, at least two separate segments of the patterned via seed layer 181 and two separate interconnection metals 30 are disposed in each of the holes 123 of the semiconductor device 1a. In addition, as indicated above, each hole 123 of the semiconductor device 1a accommodates multiple through package body vias 15a. Each such via 15a within a corresponding one of the holes 123 of the semiconductor device 1a comprises the combination of the singular dielectric material 16 disposed in such hole 123, a dedicated segment of the patterned via seed layer 181, and a dedicated interconnection metal 30. One of the primary advantages attributable to the structure of the semiconductor device 1a is that in the manufacturing process related thereto, the time needed for the formation of the holes 123 is substantially reduced as a result of the reduced number thereof, which in turn results in higher unit per hour (UPH) productivity in relation to the manufacture of the semiconductor device 1a. Within each hole 123, the pitches between the bores 161 formed in the dielectric material 16 filled into such hole 123 can be very small, and typically in the range of from about 10 µm to about 100 µm.

In the semiconductor device 1a, the outer openings 142 formed in the first passivation layer 14 will be sized to accommodate respective ones of the holes 123. In this regard, the quadrangular sidewall defined by each hole 142 in the first passivation layer 14 of the semiconductor device 1a is spaced outwardly relative to the periphery of the corresponding hole 123 such that the first passivation layer 14 in the semiconductor device 1a does not affect the laser drilling process used to facilitate the formation of each of the holes 123. As a result of this relative sizing between each outer opening 142 and the corresponding hole 123 in the semiconductor device 1a, the dielectric material 16 disposed in each such hole 123 will cover a portion of the first surface 121 of the package body 12, in addition to covering the sidewall of the corresponding outer opening 142 of the first passivation layer 14.

Referring now to FIGS. 8-21, there is depicted an exemplary sequence of steps which may be used to facilitate the fabrication of the semiconductor device 1 shown in FIGS. 1-5. FIGS. 8-21 depict the process steps in terms of the fabrication of only a single semiconductor device 1. However, those of ordinary skill in the art will recognize that the process is typically implemented in manner facilitating the simultaneous fabrication of multiple semiconductor devices 1.

Figure 8:
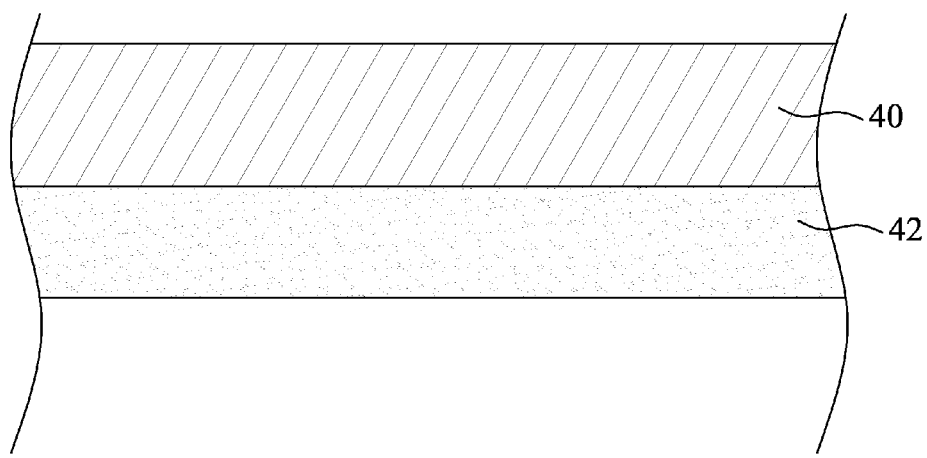
FIGS. 8-21 illustrate an exemplary sequence of steps which may be used to facilitate the fabrication of the semiconductor device shown in FIGS. 1-5.

In the initial step of the fabrication process shown in FIG. 8, a carrier, which may comprise a glass plate or a silicon wafer, is provided and includes an adhesive film 42 applied to one side or face thereof.

Figure 9:
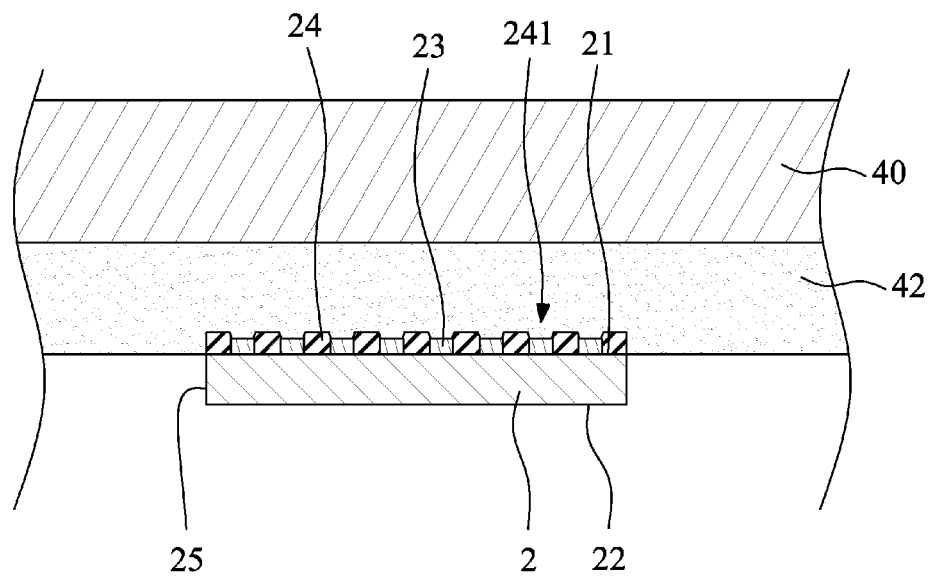

In the next step of the fabrication process shown in FIG. 9, at least one, and preferably a plurality of the semiconductor chips 2, are disposed on the adhesive film 42 applied to the carrier 40. Each semiconductor chip 2 has the above-described protective layer 24 applied to the active surface 21 thereof prior to its operative engagement to the adhesive film 42. As further apparent from FIG. 9, the protective layer 24 applied to the active surface 21 is engaged directly to the adhesive film 42, with the backside surfaces 22 of the semiconductor chips 2 thus being disposed furthest from the adhesive film 42.

Figure 10:
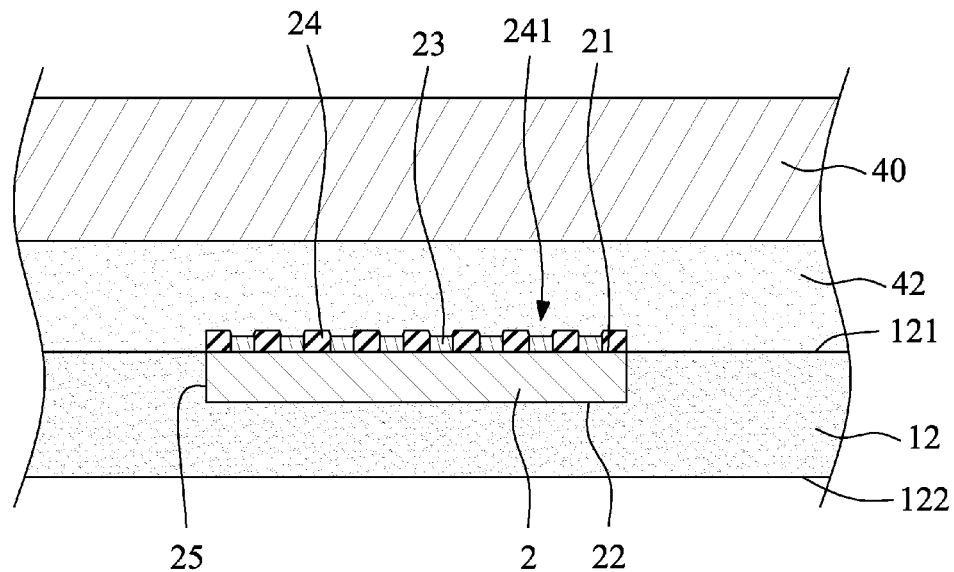

In the next step of the fabrication process shown in FIG. 10, the semiconductor chips 2 are encapsulated by the package body 12. More particularly, the package body 12 encapsulates or covers the side surface 25 and the backside surface 22 of each semiconductor chip 2. In addition, the first surface 121 of the package body 12 contacts the adhesive film 42, and is thus substantially continuous or co-planar with the active surface 21 of each semiconductor chip 2.

Figure 11:
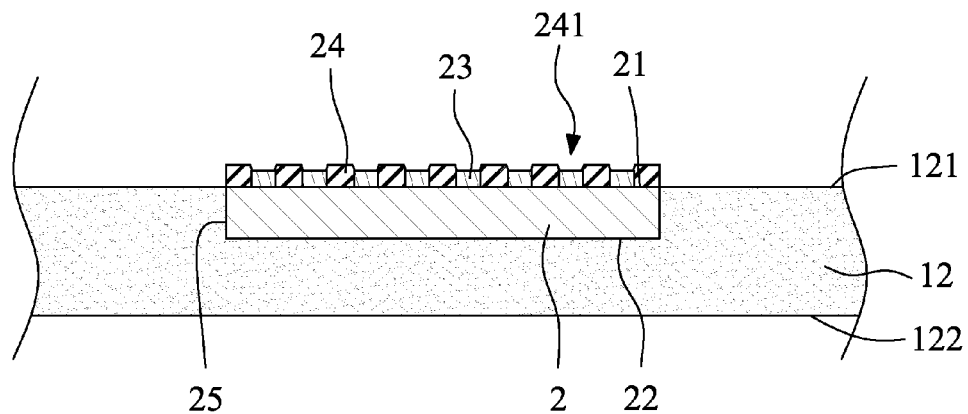

In the next step of the fabrication process shown in FIG. 11, the carrier 40 and the adhesive film 42 are removed, thus exposing the first surface 121 of the package body 12 and the protective layer 24 applied to the active surface 21 of each semiconductor chip 2. For each semiconductor chip 2, the pads 23 thereof are effectively exposed within respective ones of the openings 241 of the corresponding protective layer 24.

Figure 12:
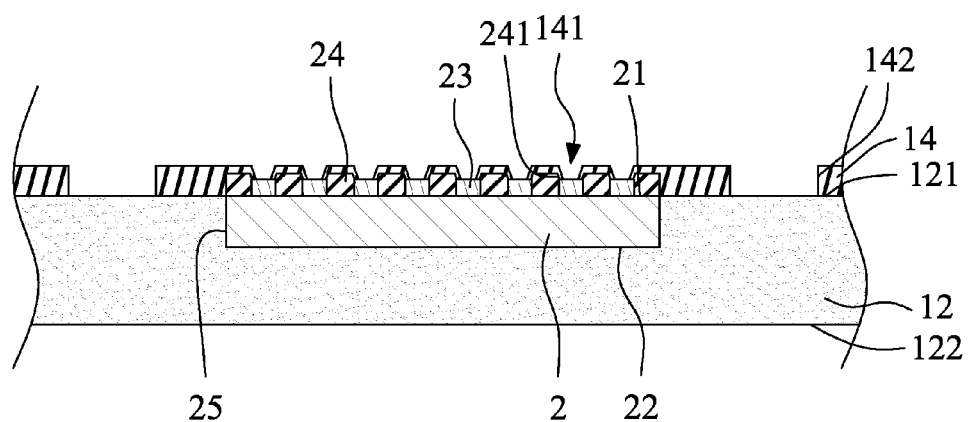

In the next step of the fabrication process shown in FIG. 12, the first passivation layer 14 is applied to the protective layer 24 of each semiconductor chip 2 partially encapsulated by the package body 12. As shown in FIG. 12, a portion of the first passivation layer 14, in addition to contacting the protective layers 24 of the semiconductor chips 2, also contacts a portion of the first surface 121 of the package body 12. The inner openings 141 of the first passivation layer 14 are coaxially aligned with respective ones of the openings 241 of the protective layers 24 to facilitate the exposure of the pads 23 of the semiconductor chips 2.

Figure 13:
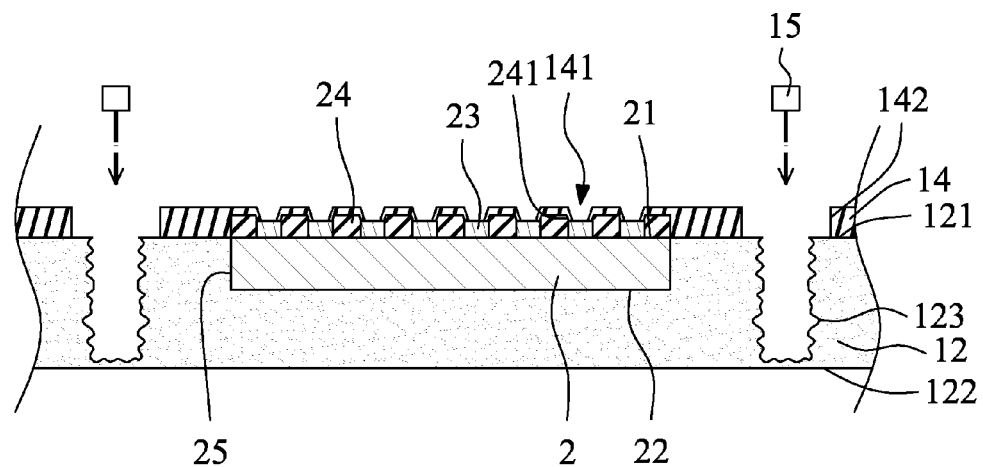

In the next step of the fabrication process shown in FIG. 13, a multiplicity of through holes 123 are formed in the package body 12 through the use of a first laser 15. As is apparent from FIG. 13, laser energy from the first laser 15 is applied to portions of the first surface 121 of the package body 12 which are exposed in each of the outer openings 142 defined by the first passivation layer 14. In the fabrication step shown in FIG. 13, each hole 123 is a blind hole, and thus does not extend to the second surface 122 of the package body 12 at this stage. As previously explained, the diameter of each outer opening 142 of the first passivation layer 14 is greater than that of the corresponding hole 123, the first laser 15 thus only drilling the package body 12, and not being affected by the first passivation layer 14. The wavelength of the first laser 15 is preferably in the range of from about 254 nm to about 10640 nm. As also indicated above, upon the completion of the laser drilling process, the sidewall of each hole 123 has a first surface roughness value in the range of from about 5 µm to about 100 µm attributable to the differences in the laser absorption characteristics of the epoxy resin and the $SiO_2$ fillers 125 included in the package body 12.

Figure 14:
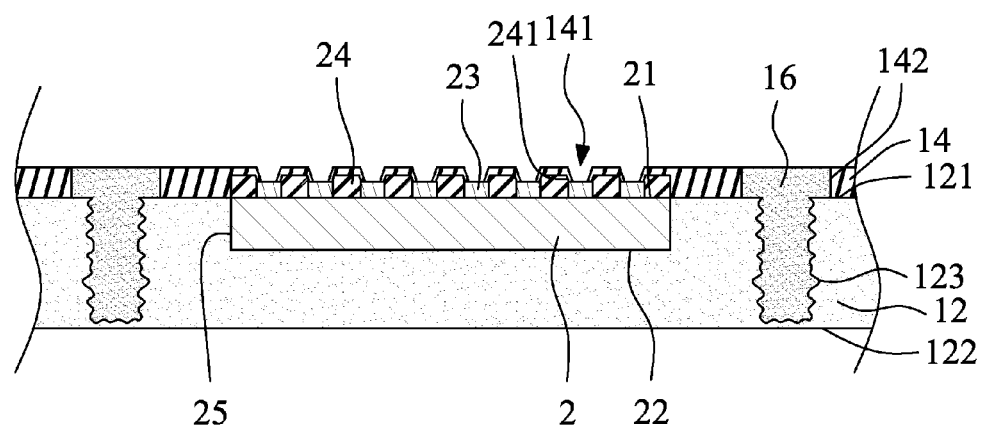

In the next step of the fabrication process shown in FIG. 14, each hole 123 and the corresponding outer opening 142 in the first passivation layer 14 are filled with the dielectric material 16.

Figure 15:
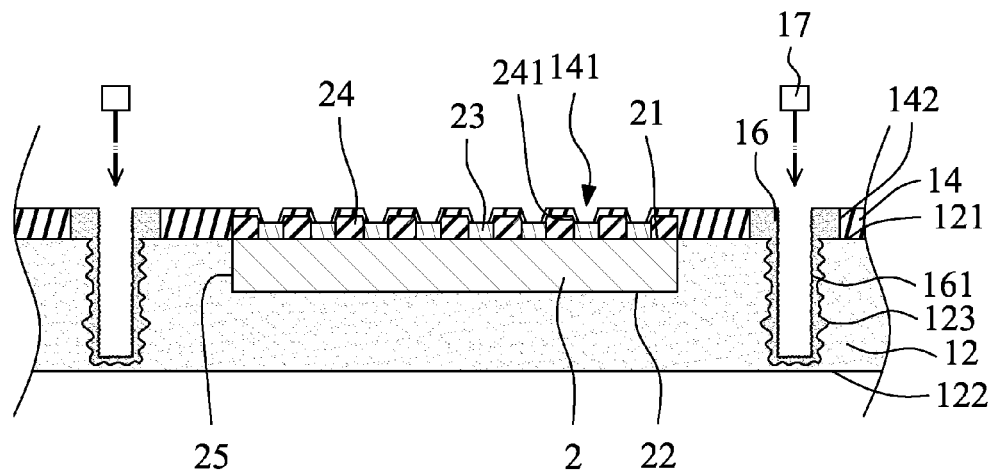

In the next step of the fabrication process shown in FIG. 15, the dielectric material 16 filled into each hole 123 is drilled through the use of a second laser 17 (which may or may not be the same as device as first laser 15), such drilling operation facilitating the formation of the bore 161 within the dielectric material 16. The dielectric material 16 remains on the sidewall of the corresponding hole 123 and on the sidewall of the corresponding outer opening 142 when the second laser drilling operation is completed through the use of the second laser 17. As indicated above, the sidewall of the bore 161 defined by the second laser drilling process has a second surface roughness value typically in the range of from about 2 μm to about 20 μm, which is less than the aforementioned first surface roughness value of the sidewall of the corresponding hole 123. It is contemplated that the wavelength of the second laser 17 will be equal to or less than that of the first laser 15.

Figure 16:
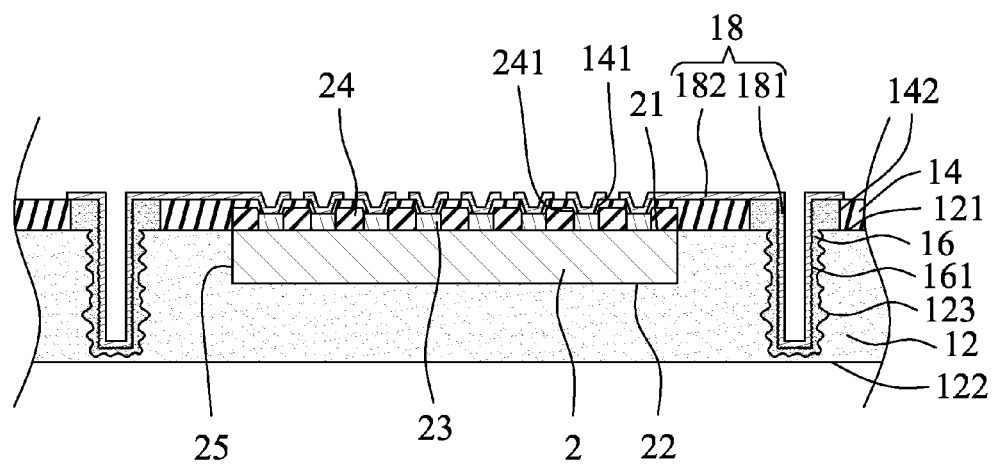

In the next step of the fabrication process shown in FIG. 16, a seed layer 18, which is preferably formed from Ti/Cu, is plated in each bore 161 and on the first passivation layer 14. The seed layer 18 defines both the via seed layer 181 and the surface seed layer 182 described above in relation to the completed semiconductor device 1. Since, as indicated above, the second surface roughness value of the sidewall of each bore 161 is less than the first surface roughness value of the sidewall of the corresponding hole 123, the plating time used to facilitate the formation of the seed layer 18 (and in particular the portion thereof defining the via seed layer 181) is short (thereby reducing fabrication costs), with the plating quality being easy to control and of a high grade. The seed layer 18 is then patterned to define each pair of the integrally connected discrete segments of the via and surface seed layers 181, 182 described above. More particularly, as a result of such patterning, the seed layer 18 is caused to define the via seed layer 181 which is segregated into separate segments corresponding to respective ones of the bores 161, and the surface seed layer 182 which is also segregated into separate segments, each of which is integrally connected to a corresponding segment of the via seed layer 181 and further extends into one or more of the inner openings 141 defined by the first passivation layer 14 so as to contact one or more of the pads 23 of a corresponding semiconductor chip 2.

Figure 17:
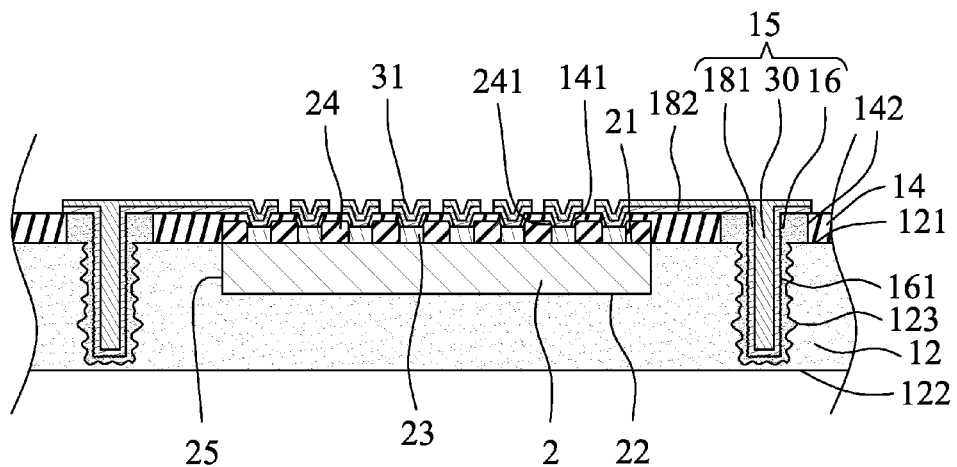

In the next step of the fabrication process shown in FIG. 17, a metal material, such as Cu, is plated on the via and surface seed layers 181, 182. The metal material is then patterned. Such patterning results in the metal material being formed on each discrete segment of the via seed layer 181 and filling the corresponding bore 161 to define the interconnection metal 30 of a corresponding via 15, and the metal material further being formed on each discrete segment of the surface seed layer 182 to define a corresponding segment of the patterned conductive layer 31. As previously explained, the interconnection metal 30 of each via 15 is preferably a solid metal pillar, though it may alternatively define a core of insulation material which is surrounded by a conductive metal material.

Figure 18:
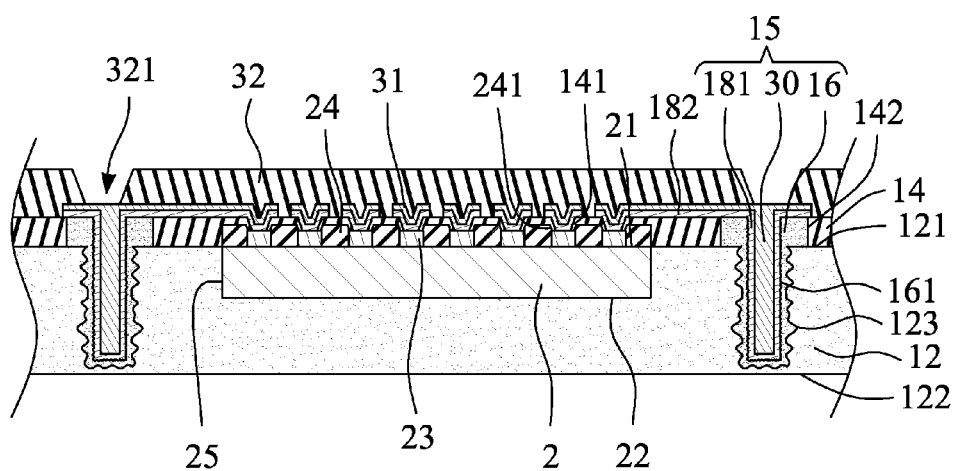

In the next step of the fabrication process shown in FIG. 18, the second passivation layer 32 is formed on the patterned conductive layer 31 and the first passivation layer 14. The second openings 321 defined by the second passivation layer 32 expose portions of respective ones of the segments defined by the patterned conductive layer 31.

Figure 19:
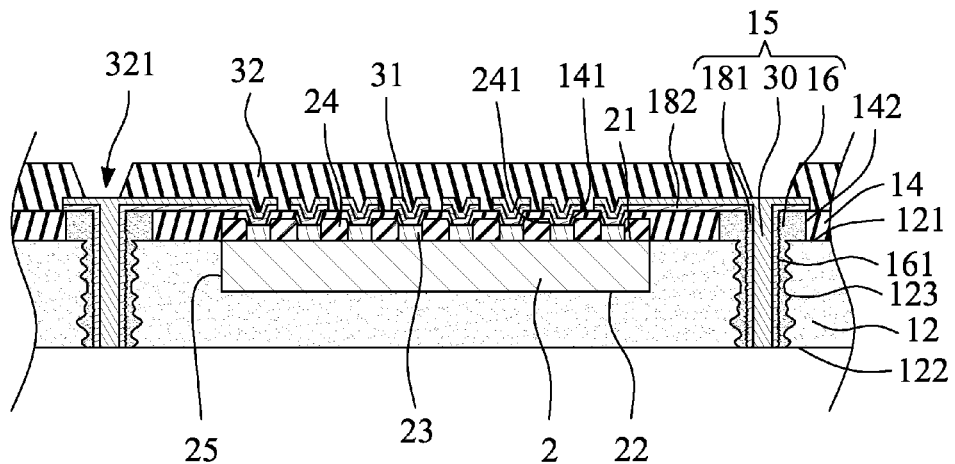

In the next step of the fabrication process shown in FIG. 19, the package body 12 is thinned from its second surface 122 by a grinding or etching process. Such grinding or etching process effectively exposes the interconnection metal 30 of each via 15, and further effectively causes each hole 123, originally a blind hole, to become a through hole.

Figure 20:
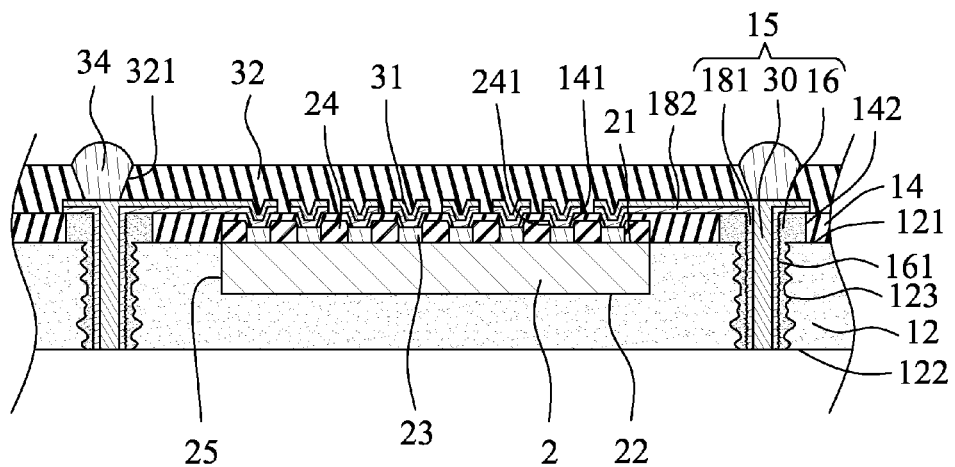

In the next step of the fabrication process shown in FIG. 20, a plurality of contacts 34 such as solder balls are formed in respective ones of the second openings 321 defined by the second passivation layer 32 to contact respective segments of the patterned conductive layer 31.

Figure 21:
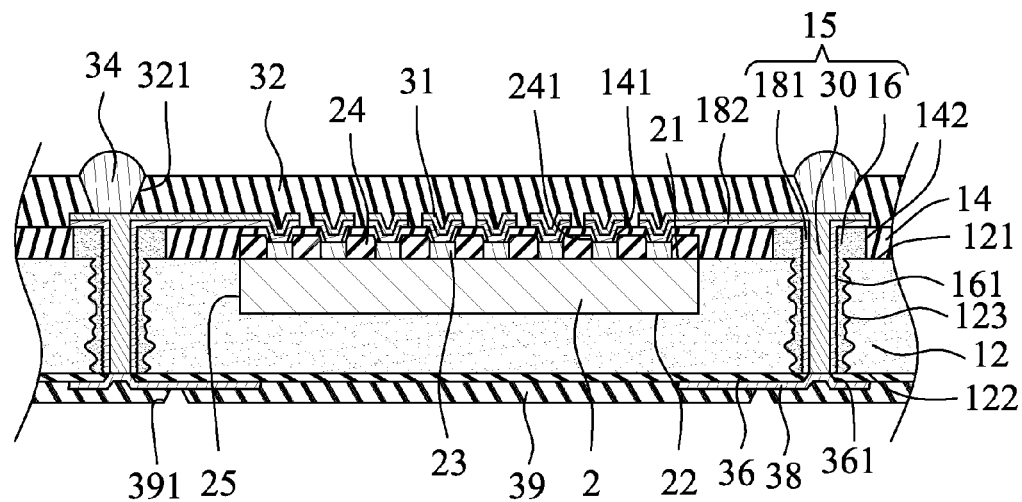

In the next step of the fabrication process shown in FIG. 21, the third passivation layer 36 is formed on the second surface 122 of the package body 12. Each of the third openings 361 defined by the third passivation layer 36 is aligned with and thus exposes the interconnection metal 30 of a corresponding via 15. Subsequent to the formation of the third passivation layer 36, the backside circuit layer 38 is formed on the third passivation layer 36. The backside circuit layer 38 is patterned to define a plurality of discrete segments, each of which extends into a respective one of the third openings 361 defined by the third passivation layer 36 to contact the interconnection metal 30 of a corresponding via 15. Thereafter, the fourth passivation layer is disposed on both the backside circuit layer 38 and the third passivation layer 36. Each of the four openings 391 defined by the fourth passivation layer 39 exposes a portion of a respective one of the segments defined by the patterned backside circuit layer 38. Under bump metallizations 44 as shown in FIG. 1 are then formed in respective ones of each of the fourth openings 391 defined by the fourth passivation layer 39.

In the final step of the fabrication process, the package body 12, as well as the first, second, third and fourth passivation layers 14, 32, 36, 39, are then cut or singulated to form a plurality of the individual semiconductor devices 1 as shown in FIG. 1. In each such semiconductor device 1, the peripheral side surfaces of the package body 12 and each of the first, second, third and fourth passivation layers 14, 32, 36, 39 are formed as a result of such singulation process. However, each semiconductor chip 2 and the via(s) 15 corresponding thereto are preferably provided with a dedicated seed layer 18, a dedicated metal layer and a dedicated backside circuit layer 38 as each described above.

Referring now to FIGS. 22-27, there is depicted an exemplary sequence of steps which may be used to facilitate the fabrication of the semiconductor device 1a shown in FIGS. 6-7. The method implemented to facilitate the fabrication of the semiconductor device 1a is substantially similar to that described above in relation to the fabrication of the semiconductor device 1, with only the distinctions being highlighted below.

Figure 22:
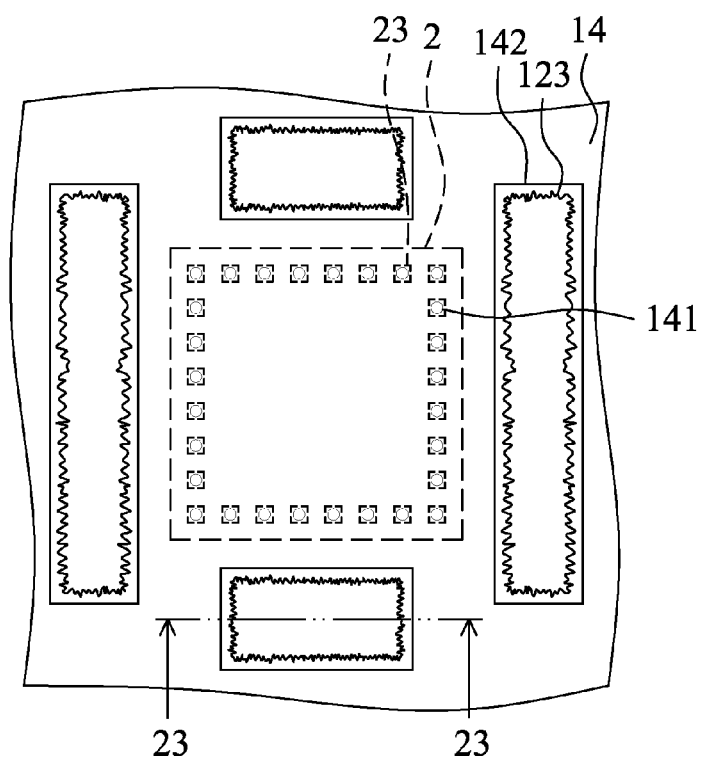
FIGS. 22-27 illustrate an exemplary sequence of steps which may be used to facilitate the fabrication of the semiconductor device shown in FIGS. 6-7.
Figure 23:
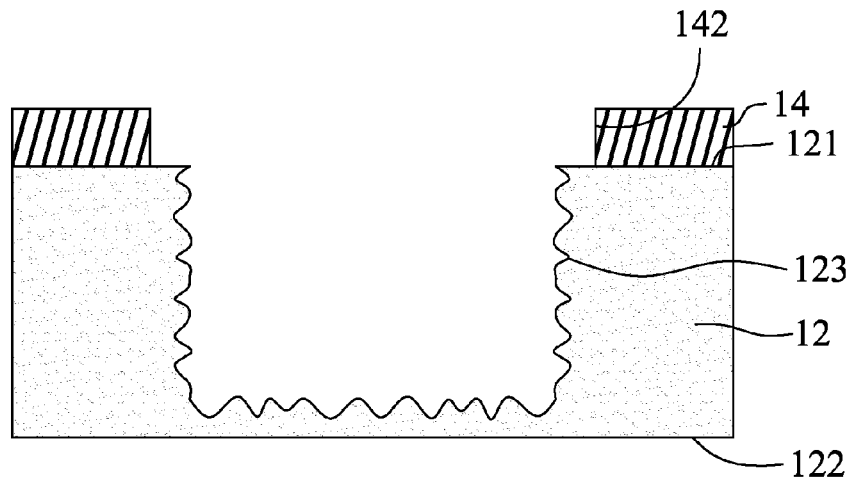

Referring to FIG. 22, a distinction between the fabrication processes for the semiconductor devices 1, 1a lies in the first laser drilling process described above in relation to FIG. 13 to form the holes 123 in the semiconductor device 1 instead being used to form the increased size holes 123 of the semiconductor device 1a. More particularly, in the step of the fabrication process for the semiconductor device 1a shown in FIG. 23, the first laser drilling process is completed in a manner facilitating the formation of the increased size holes 123, each of which has a generally quadrangular, rather than circular, configuration.

Figure 24:
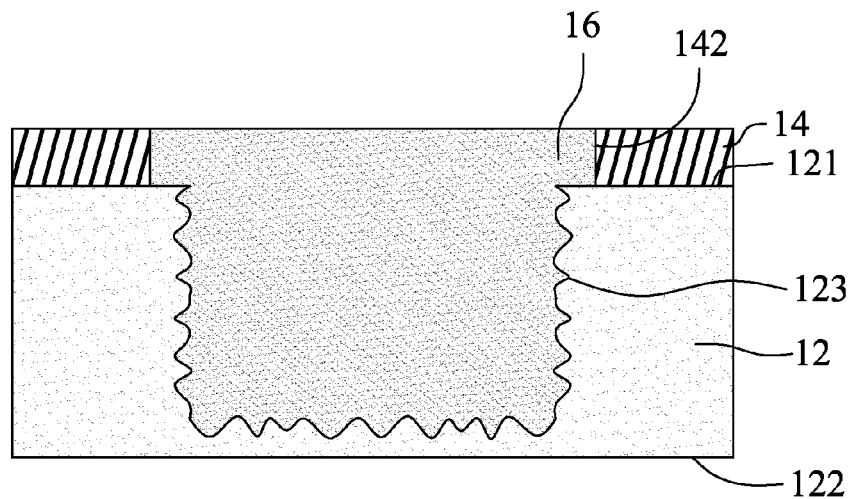

In the next step of the fabrication process shown in FIG. 24, each such hole 123 of increased size is filled with the dielectric material 16.

Figure 25:
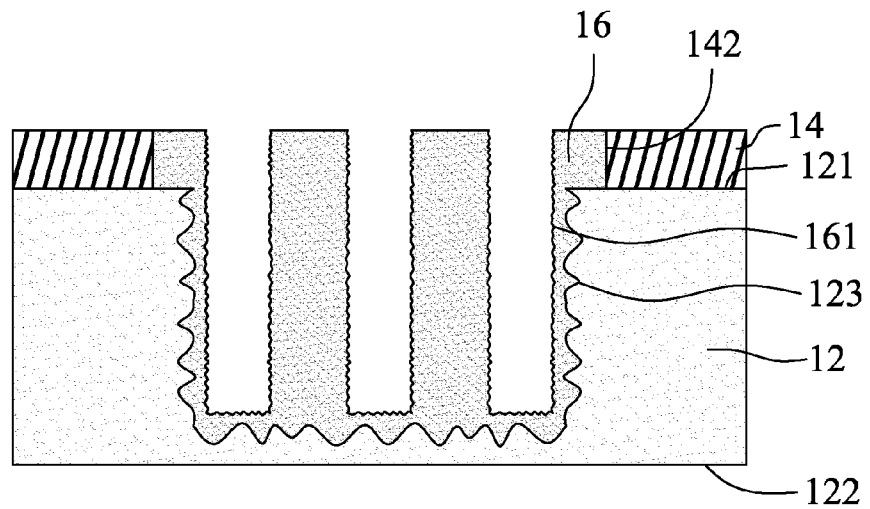

In the next step of the fabrication process shown in FIG. 25, the second laser drilling process described above in relation to FIG. 15 is carried out in relation to the dielectric material 16 filled into each hole 123 so as to form multiple bores 161 therein.

Figure 26:
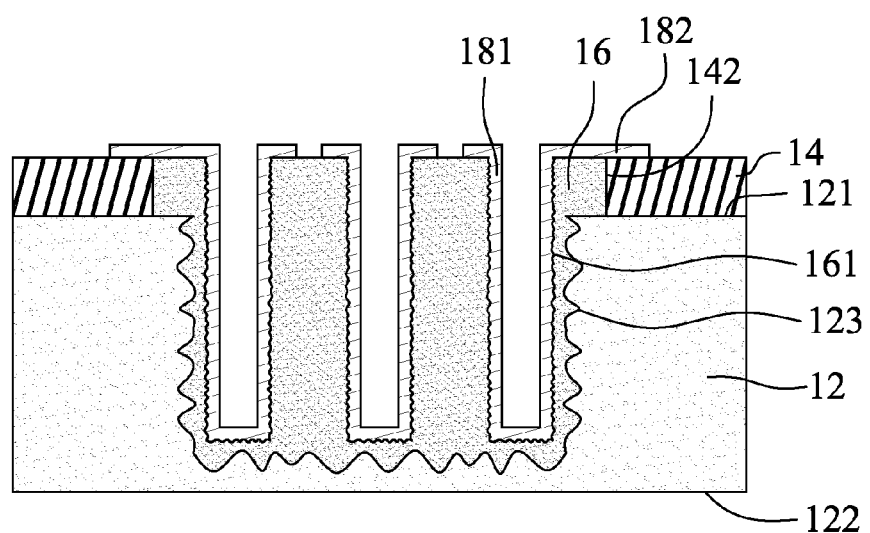

In the next step of the fabrication process shown in FIG. 26, the seed layer 18, which is preferably formed from Ti/Cu, is plated in each bore 161 and on the first passivation layer 14.

The seed layer 18 is then patterned to define each pair of the integrally connected discrete segments of the via and surface seed layers 181, 182 described above. More particularly, as a result of such patterning, the seed layer 18 is caused to define the via seed layer 181 which is segregated into separate segments corresponding to respective ones of the bores 161, and the surface seed layer 182 which is also segregated into separate segments, each of which is integrally connected to a corresponding segment of the via seed layer 181 and further extends into one or more of the inner openings 141 defined by the first passivation layer 14 so as to contact one or more of the pads 23 of a corresponding semiconductor chip 2. Thus, the seed layer 18 defines both the via seed layer 181 and the surface seed layer 182 in the completed semiconductor device 1a.

Figure 27:
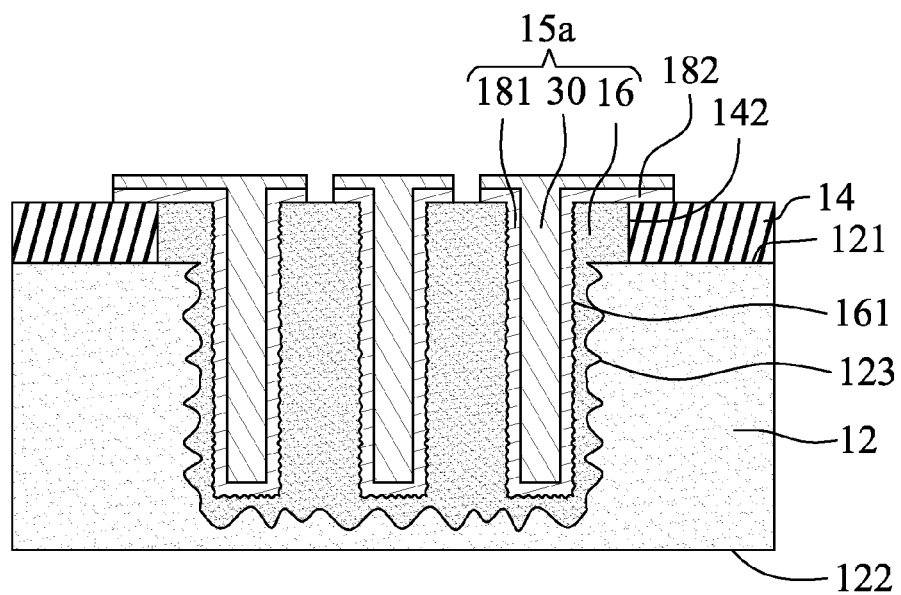

In the next step of the fabrication process shown in FIG. 27, a metal material, such as Cu, is plated on the seed layer 18. The metal material is then patterned. Such patterning results in the metal material being formed on each discrete segment of the via seed layer 181 and filling the corresponding bore 161 to define the interconnection metal 30 of a corresponding via 15a, and the metal material further being formed on each discrete segment of the surface seed layer 182 to define a corresponding segment of the patterned conductive layer 31. The subsequent steps used to facilitate the fabrication of the semiconductor device 1a are similar to those shown and described above in relation to FIGS. 18-21.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device, comprising:
   a semiconductor chip including a plurality of conductive pads;
   a package body at least partially encapsulating the semiconductor chip, the package body being a composite material which includes resin and fillers and having at least one hole formed therein defining a hole sidewall which is partially defined by portions of the fillers protruding from the resin and is of a first surface roughness value; and
   at least one through package body via disposed in the hole, the via comprising a dielectric material disposed on the hole sidewall of the hole and defining at least one bore having a bore sidewall which is of a second surface roughness value less than the first surface roughness value.

2. The semiconductor device of claim 1 wherein the first surface roughness value of the hole sidewall is in the range of from about 5 µm to about 100 µm.

3. The semiconductor device of claim 1 wherein the second surface roughness value of the bore sidewall is in the range of from about 2 µm to about 20 µm.

4. The semiconductor device of claim 1 wherein the resin is epoxy resin and the fillers are $SiO_2$ fillers.

5. The semiconductor device of claim 1 wherein the via further comprises:
   a seed layer disposed on the bore sidewall thereof; and
   an interconnection metal which is disposed within the bore and on at least a portion of the seed layer.

6. The semiconductor device of claim 5 further comprising a conductive layer which is integrally connected to the interconnection metal and facilitates the electrical connection thereof to at least one of the pads of the semiconductor chip, the conductive layer overlying a portion of the seed layer.

7. The semiconductor device of claim 1 wherein at least two through package body vias are disposed in the hole, each of the vias comprising a respective one of at least two bores which are defined by the dielectric material and each have a bore sidewall which is of the second surface roughness value less than the first surface roughness value.

8. The semiconductor device of claim 7 wherein each of the vias further comprises:
   a seed layer disposed on the bore sidewall thereof; and
   an interconnection metal which is disposed within the bore thereof and on at least a portion of the seed layer thereof.

9. The semiconductor device of claim 7 wherein:
   the first surface roughness value of the hole sidewall is in the range of from about 5 µm to about 100 µm; and
   the second surface roughness value of the bore sidewall of each of the bores defined by the dielectric material is in the range of from about 2 µm to about 20 µm.

10. A semiconductor device, comprising:
    a semiconductor chip;
    a package body at least partially encapsulating the semiconductor chip, the package body being a composite material which includes resin and fillers and having a plurality of holes formed therein and surrounding the semiconductor chip, wherein each of the holes defines a hole sidewall which is partially defined by portions of the fillers protruding from the resin and is of a first surface roughness value; and
    at least one through package body via disposed in the hole, the via being formed in manner wherein a prescribed via surface defined by one portion thereof is of a second surface roughness value less than the first surface roughness value as facilitates an increase in the plating quality of another portion of the via which is formed on the via surface.

11. The semiconductor device of claim 10 wherein the first surface roughness value of the hole sidewall is in the range of from about 5 µm to about 100 µm.

12. The semiconductor device of claim 10 wherein the second surface roughness value of the via surface is in the range of from about 2 µm to about 20 µm.

13. The semiconductor device of claim 10 wherein the resin is epoxy resin and the fillers are $SiO_2$ fillers.

14. The semiconductor device of claim 10 wherein the via comprises:
    a dielectric material disposed within the hole and defining the via surface;

a seed layer disposed on the via surface; and an interconnection metal which is disposed on at least a portion of the seed layer.

15. The semiconductor device of claim 14 further comprising a conductive layer which is integrally connected to the interconnection metal and facilitates the electrical connection thereof to the semiconductor chip, the conductive layer overlying a portion of the seed layer.

16. The semiconductor device of claim 10 wherein at least two through package body vias are disposed in the hole.

17. The semiconductor device of claim 16 wherein:

a dielectric material which is disposed within the hole defines the via surface of each of the vias;

a seed layer is disposed on the via surface of each of the vias; and an interconnection metal is disposed on at least a portion of the seed layer of each of the vias.

18. A semiconductor device, comprising:

a semiconductor chip;

a package body at least partially encapsulating the semiconductor chip, the package body being a composite material which includes resin and fillers and having at least one hole formed therein defining a hole sidewall which is partially defined by portions of the fillers protruding from the resin and is of a first surface roughness value; and at least one through package body via disposed in the hole, the via comprising:

a dielectric material disposed on the hole sidewall and defining at least one bore having a bore sidewall; and a seed layer which is plated onto at least a portion of the bore sidewall, the bore sidewall being of a second surface roughness value less than the first surface roughness value as facilitates an increase in the plating quality of the seed layer thereto.

19. The semiconductor device of claim 18 wherein the first surface roughness value of the hole sidewall is in the range of from about 5 μm to about 100 μm.

20. The semiconductor device of claim 18 wherein the second surface roughness value of the bore sidewall is in the range of from about 2 μm to about 20 μm.

* * * * *